US009666412B1

(12) United States Patent
Litman et al.

(10) Patent No.: US 9,666,412 B1
(45) Date of Patent: May 30, 2017

(54) METHOD FOR CHARGING AND IMAGING AN OBJECT

(71) Applicant: Applied Materials Israel, Ltd., Rehovot (IL)

(72) Inventors: Alon Litman, Nes-Ziona (IL); Yoram Uziel, Misgav (IL); Benzion Sender, Modiin-Macabim-Reut (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 15/005,679

(22) Filed: Jan. 25, 2016

(51) Int. Cl.
*H01J 37/28* (2006.01)
*H01J 37/20* (2006.01)

(52) U.S. Cl.
CPC .............. *H01J 37/28* (2013.01); *H01J 37/20* (2013.01); *H01J 2237/0048* (2013.01)

(58) Field of Classification Search
CPC .......................... H01J 37/28; H01J 2237/0048
See application file for complete search history.

(56) References Cited

U.S. PATENT DOCUMENTS

| 7,253,410 B1* | 8/2007 | Bertsche | H01J 37/026 250/307 |
| 2011/0278452 A1* | 11/2011 | Nozoe | H01J 37/244 250/307 |

* cited by examiner

*Primary Examiner* — Wyatt Stoffa
*Assistant Examiner* — Eliza Osenbaugh-Stewar
(74) *Attorney, Agent, or Firm* — Kilpatrick Townsend & Stockton LLP

(57) ABSTRACT

A system that may include a first mechanical stage, a second mechanical stage, charged particle beam optics and a controller. The system may charge, with a charged particle beam, a slice of the object. During the charging of the slice the first mechanical stage may introduce a first movement along a first direction, between the object and charged particle beam optics. The charged particle beam optics may scan the slice with the charged particle beam. The scanning of the slice includes performing, by the charged particle optics, a first counter-movement deflection of the charged particle beam to at least partially counter the first movement. The second mechanical stage is configured to introduce a second movement along a second direction, between the object and the charged particle beam optics. Upon a completion of the charging of the slice, the second mechanical stage is configured to perform a first flyback operation.

12 Claims, 8 Drawing Sheets

Introducing, by a first mechanical stage, a first movement along a first direction, between the object and charged particle beam optics. 511

Scanning the slice with the charged particle beam thereby causing the slice to be charged. Performing, by the charged particle beam optics, a first counter-movement deflection of the charged particle beam to at least partially counter the first movement. Deflecting the charged particle beam according to a scan pattern. 512

Introducing, by a second mechanical stage, a second movement along a second direction, between the object and the charged particle beam optics. 513

510

Introducing, by the first mechanical stage, a third movement along the first direction, between the object and charged particle beam optics. 531

Scanning the slice with the charged particle beam thereby causing the slice to emit charged particles that are detected and form images of areas of the slice. Performing, by the charged particle beam optics, a second counter movement deflection of the charged particle beam to at least partially counter the third movement. 532

Introducing, by the second mechanical stage, a fourth movement along the second direction, between the object and the charged particle beam optics. 533

Introducing, by the first mechanical stage, a fifth movement along the first direction, between the object and charged particle beam optics. 551

Scanning the slice with the charged particle beam thereby causing the slice to be discharged. Performing, by the charged particle optics, a third counter-movement deflection of the charged particle beam to at least partially counter the fifth movement. 552

Introducing, by the second mechanical stage, a sixth movement along the second direction, between the object and the charged particle beam optics. 553

METHOD FOR CHARGING AND IMAGING AN OBJECT

BACKGROUND OF THE INVENTION

Wafers are manufactured by highly complicated manufacturing processes. These manufacturing processes should be monitored in order to ensure the quality of the wafers.

A wafer is translated during the monitoring process by a heavy movable stage that weighs few hundred of kilograms. The heavy movable stage has a limited speed.

The monitoring process may require charging elements of the wafer, waiting a predefined period, and imaging the elements of the wafer.

When the predefined period is relatively long (for example more than half a minute), the monitoring process has to be halted until the predefined process ends. Alternatively, during the predefined period the wafer is moved by the heavy movable stage along a substantial distance and the heavy movable stage has to perform a flyback operation along the entire substantial distance. This flyback operation is relatively long and also reduced the throughput of the monitoring process.

There is a growing need to provide an efficient monitoring process.

SUMMARY

According to an embodiment of the invention there may be provided a system for charge control and for imaging an object, the system may include a first mechanical stage, a second mechanical stage, charged particle beam optics and a controller; wherein the system may be configured to charge, with a charged particle beam, a slice of the object, starting at a beginning of the slice and ending at an end of the slice; wherein during the charging of the slice: the first mechanical stage may be configured to introduce a first movement along a first direction, between the object and charged particle beam optics; the charged particle beam optics may be configured to scan the slice with the charged particle beam thereby causing the slice to be charged; wherein the scanning of the slice may include performing, by the charged particle optics, a first counter-movement deflection of the charged particle beam to at least partially counter the first movement; the second mechanical stage may be configured to introduce a second movement along a second direction, between the object and the charged particle beam optics; wherein the second direction may be oriented to the first direction; wherein the first mechanical stage may be heavier than the second mechanical stage; wherein a maximal velocity of the second mechanical stage may exceed a maximal velocity of the first mechanical stage; wherein upon a completion of the charging of the slice, the second mechanical stage may be configured to perform a first flyback operation that counters the second movement thereby positioning the beginning of the slice within a field of view of the charged particle beam optics; wherein the system may be configured to image the slice; wherein during the imaging of the slice: the first mechanical stage may be configured to introduce a third movement along the first direction, between the object and charged particle beam optics; the charged particle beam optics may be configured to perform a second counter movement deflection of the charged particle beam to at least partially counter the third movement; the second mechanical stage may be configured to introduce a fourth movement along the second direction, between the object and the charged particle beam optics; and wherein upon a completion of the imaging of the slice the second mechanical stage may be configured to perform a second flyback operation that counters the fourth movement.

The system may be configured to discharge, after the second flyback operation, with the charged particle beam, the slice of the object; wherein during the discharging of the slice: the first mechanical stage may be configured to introduce a fifth movement along the first direction, between the object and charged particle beam optics; the charged particle beam optics may be configured to scan the slice with the charged particle beam thereby causing the slice to be discharged; wherein the scanning of the slice may include performing, by the charged particle optics, a third counter-movement deflection of the charged particle beam to at least partially counter the fifth movement; the second mechanical stage may be configured to introduce a sixth movement along the second direction, between the object and the charged particle beam optics; and upon a completion of the discharging of the slice the second mechanical stage may be configured to perform a third flyback operation that counters the sixth movement.

The system may be configured to repeat, for each slice of the object out of multiple slices of the object, a charging of the slice, a performing of the first flyback operation, an imaging of the slice and a performing of the second flyback operation.

The ratio between an average velocity of the first flyback operation and an average velocity of the first movements may exceed ten.

The ratio between an average velocity of the first flyback operation and an average velocity of the first movements may exceed one hundred.

The ratio between a length of the slice along the second direction and a width of the slice along the first direction may exceed five hundred.

According to an embodiment of the invention there may be provided a method for charge control and for imaging an object, the method may include charging, with a charged particle beam, a slice of the object, starting at a beginning of the slice and ending at an end of the slice; wherein the charging of the slice may include: introducing, by a first mechanical stage, a first movement along a first direction, between the object and charged particle beam optics; scanning the slice with the charged particle beam thereby causing the slice to be charged; wherein the scanning of the slice may include performing, by the charged particle optics, a first counter-movement deflection of the charged particle beam to at least partially counter the first movement; introducing, by a second mechanical stage, a second movement along a second direction, between the object and the charged particle beam optics; wherein the second direction may be oriented to the first direction; wherein the first mechanical stage may be heavier than the second mechanical stage; wherein a maximal velocity of the second mechanical stage may exceed a maximal velocity of the first mechanical stage; upon a completion of the charging of the slice, performing by the second mechanical stage a first flyback operation that counters the second movement thereby positioning the beginning of the slice within a field of view of the charged particle beam optics; imaging the slice; wherein the imaging of the slice may include: introducing, by the first mechanical stage, a third movement along the first direction, between the object and charged particle beam optics; performing, by the charged particle beam optics, a second counter movement deflection of the charged particle beam to at least partially counter the third movement; introducing, by the second mechanical stage, a fourth movement along the second direction, between the object and the charged particle beam optics; and upon a completion of the imaging of the slice performing, by the second mechanical stage, a second flyback operation that counters the fourth movement.

The performing of the second flyback operation may be followed by discharging, with the charged particle beam, the slice of the object; wherein the discharging of the slice may include introducing, by the first mechanical stage, a fifth movement along the first direction, between the object and charged particle beam optics; scanning the slice with the charged particle beam thereby causing the slice to be discharged; wherein the scanning of the slice may include performing, by the charged particle optics, a third counter-movement deflection of the charged particle beam to at least partially counter the fifth movement; introducing, by the second mechanical stage, a sixth movement along the second direction, between the object and the charged particle beam optics; and upon a completion of the discharging of the slice performing, by the second mechanical stage, a third flyback operation that counters the sixth movement.

The method may include repeating, for each slice of the object out of multiple slices of the object the steps of charging the slice, performing the first flyback operation, imaging the slice and performing the second flyback operation.

The ratio between an average velocity of the first flyback operation and an average velocity of the first movements may exceed ten.

The ratio between an average velocity of the first flyback operation and an average velocity of the first movements may exceed one hundred.

The ratio between a length of the slice along the second direction and a width of the slice along the first direction may exceed five hundred.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 6 illustrates a method according to an embodiment of the invention;

FIG. 8 illustrates a method according to an embodiment of the invention.

Figure 1:
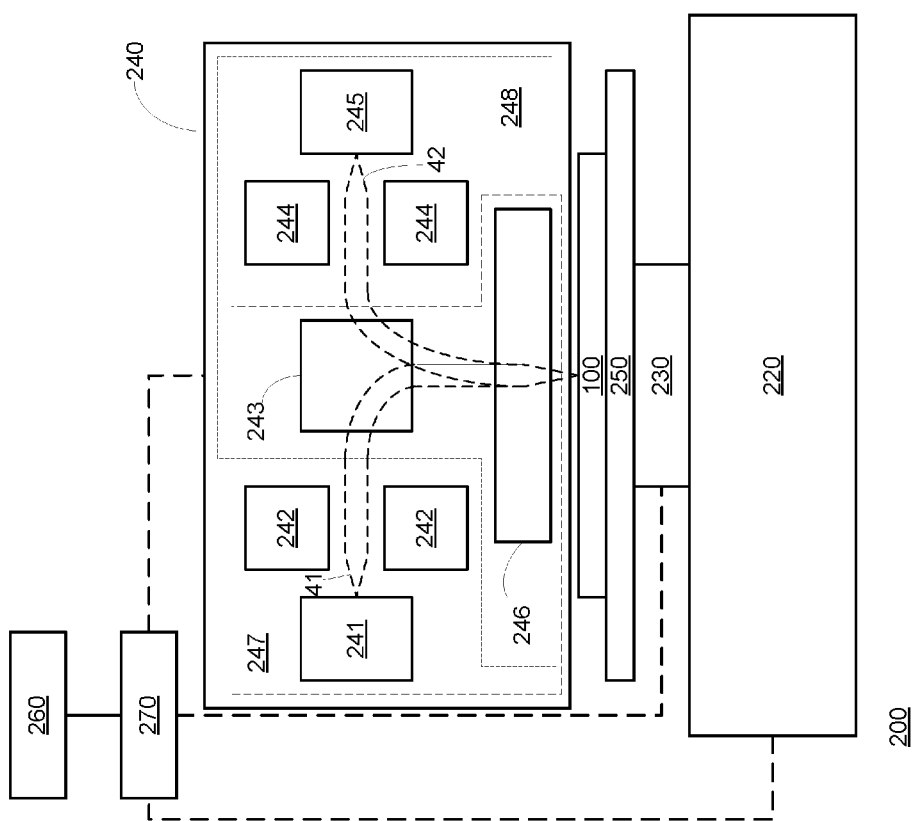
FIG. 1 illustrates a system and an object according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

The term slice refers to a region that has a region length that well exceeds (by at least a factor of 10) a region width.

FIG. 1 illustrates a system 200 and an object 100 according to an embodiment of the invention.

Object 100 may be a wafer, a solar panel, a micro-machined substrate and the like.

System 200 includes first mechanical stage 220, second mechanical stage 230, chuck 250, charged particle beam optics 240, interface 260 and controller 270.

Charged particle beam optics 240 includes charged particle beam irradiation module 247 for illuminating the object 100 with one or more charged particle beams and imaging module 248 for collecting radiation from the object 100.

Charged particle beam optics 240 may include one or more lenses, one or more lenses deflectors, one or more lenses beam splitters, one or more lenses collimators, one or more lenses apertures, one or more lenses radiation sources and the like.

Charged particle beam irradiation module 247, which, by way of example, is assumed to generate a primary charged particle beam 41 from an aperture of charged particle gun 241. However, the scope of the present invention is not limited to generation of a single charged particle beam, so that charged particle beam irradiation module 247 may be configured to generate multiple charged particle beams.

Furthermore, the scope of the present invention is not limited to focusing a particular type of charged particle, and includes substantially all types of charged particles, including electrons and ions such as Gallium or other metallic ions. By way of example, the description hereinbelow assumes that the primary charged particle beam comprises electrons.

Charged particle beam irradiation module 247 may include illumination lenses 242, beam splitter 243, and an objective lens 246, the illumination lenses 242 acting as focusing elements. Typically, the illumination lenses 242 and beam splitter 243 operate magnetically, although the lenses and/or the beam splitter may also incorporate other types of operation, such as electrostatic operation.

Primary charged particle beam 41 follows an irradiation path through charged particle beam irradiation module 247, and along an axis, to a surface of a object 100, the axis is typically being orthogonal to the surface.

The illumination lenses 242, beam splitter 243, and objective lens 246 focus the primary charged particle beam 41 into a focused image, hereinbelow also referred to as a spot on the surface of object 100.

Object 100 comprises a multiplicity of substantially similar dies, the dies having substantially congruent layouts. The dies are herein assumed to be rectangular dies having sides parallel to the x and y axes.

The spot generates reflected, secondary, and/or backscattered electrons as a secondary charged particle beam 42 of electrons, which passes through objective lens 246, and beam splitter 243. The secondary charged particle beam from spot follows an imaging path, via an imaging lens 244 to imaging detector 245.

Imaging detector 245 may include a phosphor screen that includes a scintillator crystal or a granulated scintillator powder. Imaging detector 245 may convert the secondary charged particle beam 42 of electrons to optical radiation, which is imaged by an imager, such as a charge coupled detector (CCD) array.

Imaging detector 245 may generate a signal indicative of the beam current.

Imaging detector 245 may include an avalanche photodiode array, which directly detects secondary charged particle beam 42 without conversion to light.

Objective lens 246, imaging lens 244, beam splitter 243, and imaging detector 245 form an imaging module 248 for system 200. The signal generated by imaging module 248 is transferred to controller 270.

Interface 260 may receive commands from an operator or another system. Interface 260 may output information obtained by system 200 during a monitoring process.

Controller 270 may control the movements of first mechanical stage 220, may control the movements of second mechanical stage 230 and may control the charged particle beam optics 240.

First mechanical stage 220 is heavier, slower and of lower acceleration than second mechanical stage 230.

First mechanical stage 220 can introduce movements of a constant velocity but this is not necessarily so. Movements of the first mechanical stage 220 can include accelerations and decelerations which are usually moderate in relation to accelerations and decelerations introduced by second mechanical stage 230.

Second mechanical stage 230 can be used to perform fast flyback operations at a speed that well exceeds the velocity of the first mechanical stage.

Second mechanical stage 230 may be a nano-stage or a micro-stage.

Second mechanical stage 230 may use magnetic levitation (maglev, or magnetic suspension) thereby supporting the object (which is suspended) with no support other than magnetic fields. Wikipedia indicates that magnetic pressure is used to counteract the effects of the gravitational and any other accelerations.

Second mechanical stage 230 may include a flexure bearing, may be a micro-stage that may include electrostatic comb-drive actuators such as illustrated in "Large range dual-axis micro-stage driven by electrostatic comb-drive actuators", Mohammad Olfatnia, Leqing Cui, Pankaj Chopra and Shorya Awtar, IOP PUBLISHING JOURNAL OF MICROMECHANICS AND MICROENGINEERING page 23 (2013) or in U.S. Pat. No. 6,806,991 titled "Fully released MEMs XYZ flexure stage with integrated capacitive feedback" all being incorporated herein by reference.

A non-limiting example of various parameters of first mechanical stage 220 and second mechanical stage 230 is provided below.

First mechanical stage 220 can be an X-Y stage that has a span of 300-450 millimeters in both X-axis and Y-axis.

Second mechanical stage 230 can be an X-Y stage that has a span of 2-10 millimeters in both X-axis and Y-axis.

Second mechanical stage 230 can have a move and settle duration that is below 30 milliseconds.

Second mechanical stage 230 may have an accuracy of about 50 nanometers.

Second mechanical stage 230 hay have a motion profile should be smooth with no deviation in vertical direction greater than 1 micron.

The motion profile of second mechanical stage 230 may have no jitter in all degrees of freedom greater than 100 nanometers at frequencies below 50 Hz.

Second mechanical stage 230 should convey a small load (for example—up to five kilograms).

Second mechanical stage 230 may be equipped with a motion control sensor that can be a laser interferometer which detects the positioning by two mirrors in X and Y directions which are attached to chuck 250.

Second mechanical stage 230 can be a flexure X-Y stage.

It is noted that each one of the first mechanical stage 220 and the second mechanical stage 230 can also introduce Z-axis (vertical) movements or be coupled to a Z-axis stage.

According to another embodiment of the invention, second mechanical stage 230 can move along a single direction—for example, second mechanical stage 230 can be an X-stage.

System 200 may track the first mechanical stage 220 and the second mechanical stage 230 using a single control loop.

System 200 may track the first mechanical stage 220 and the second mechanical stage 230 using a separate control loop for each one of the first mechanical stage 220 and the second mechanical stage 230.

According to an embodiment of the invention, system 200 may perform a dual-phase process that includes a first phase of charging a slice of the object, perform a fast flyback operation (using second mechanical stage 230), and then perform a second phase that includes imaging the slice.

The dual phase process is repeated for each slice of the object. The second phase is followed by performing a second flyback operation so that the beginning of the next slice is within the field of view of charged particle beam optics 240.

The duration of the first phase may equal the duration of the second phase. Alternatively, the duration of the first phase may differ from the duration of the second phase.

During the charging of the slice, the first mechanical stage 220 may be configured to introduce a first movement along a first direction between object 100 and charged particle beam optics 240.

During the charging of the slice second mechanical stage 230 may be configured to introduce a second movement along a second direction, between object 100 and charged particle beam optics 240.

During the charging of the slice charged particle beam optics 240 may be configured to scan the slice with a charged particle beam thereby causing the slice to be charged.

During the charging of the slice charged particle beam optics 240 may be configured to perform a first counter-movement deflection of the charged particle beam to at least partially counters the first movement.

For example, assuming that the first direction corresponds to the Y-axis and the second direction correspond to the X-axis then during the charging of the slice the charged particle beam scans the slice along the X-axis and the movement of the first mechanical stage 220 along the Y-axis is countered by the first counter movement deflection.

Upon a completion of the first phase the charged particle beam reaches to the end of the slice and there is a need to image the slice. The imaging of the slice should start from the beginning of the slice.

The second mechanical stage 230 is configured to perform a first flyback operation that counters the second movement thereby positioning the beginning of the slice within a field of view of the charged particle beam optics 240.

The duration of the first phase plus the duration of the first flyback operation substantially equal the predefined period between the charging of an element (of the slice) and the imaging of the element. Substantially equal may mean equal or have a difference of few percent (for example up to ten percent).

During the imaging of the slice the first mechanical stage 220 may be configured to introduce a third movement along the first direction, between object 100 and charged particle beam optics 240.

During the imaging of the slice the second mechanical stage 230 may be configured to introduce a forth movement along the second direction, between object 100 and charged particle beam optics 240.

During the imaging of the slice the charged particle beam optics 240 may be configured to scan the slice with a charged particle beam and acquire images of areas of the slice.

During the imaging of the slice the charged particle beam optics 240 may be configured to perform a second counter-movement deflection of the charged particle beam to at least partially counter the third movement.

Upon a completion of the second phase the charged particle beam reaches to the end of the slice and there a need to charge a next slice. The charging of the next slice may start from the beginning of the next slice.

The second mechanical stage 230 is configured to perform a second flyback operation that counters the forth movement thereby positioning the beginning of the next slice within a field of view of the charged particle beam optics 240.

According to an embodiment of the invention, system 200 may perform a triple phase process that includes (i) a first phase of charging a slice of the object, (ii) performing a fast flyback operation (using second mechanical stage 230), (ii) a second phase that includes imaging the slice, (iv) performing a second flyback operation, and (iii) a third phase that includes discharging the slice.

The triple phase process may be repeated for each slice of the object. The third phase may be followed by performing a third flyback operation so that the beginning of yet a further slice is within the field of view of charged particle beam optics 240.

The durations of the first phase, second phase and third phase may equal to each other. Alternatively, at least one phase of the first phase, second phase and third phase may have a duration that differs from the duration of at least one other phase of the first phase, second phase and third phase.

Between the end of the second phase and the beginning of the third phase a parameter of the charged particle beam (such as the energy of the charged particle beam) and/or an extraction field may be changed in order to cause the charge particle beam to discharge and not image the slice.

Between the end of the third phase and the beginning of the first phase a parameter of the charged particle beam (such as the energy of the charged particle beam) and/or an extraction field may be changed in order to cause the charge particle beam to charge and not discharge the slice.

During the discharging of the slice the first mechanical stage 220 may be configured to introduce a fifth movement along the first direction, between object 100 and charged particle beam optics 240.

During the discharging of the slice second mechanical stage 230 may be configured to introduce a sixth movement along the second direction, between object 100 and charged particle beam optics 240.

During the discharging of the slice charged particle beam optics 240 may be configured to scan the slice with a charged particle beam thereby causing the slice to be discharged.

During the discharging of the slice charged particle beam optics 240 may be configured to perform a third counter-movement deflection of the charged particle beam to at least partially counter the sixth movement.

Non-limiting examples of the predefined period, of the dimensions of the slice, and various scanning rates of a dual phase process are provided below:

a. The predefined period between charging an element of a slice and imaging the element of the slice is one second.
b. The velocity of the movement of the second mechanical stage 230 during the charging of the slice and during the imaging of the slice is ten millimeters/second.
c. The duration of each flyback operation is ten milliseconds.
d. Each pixel had a width of fifty nanometers and a length of fifty nanometers.
e. The width of the slice (along the Y axis) is one hundred microns which is equivalent to two thousand pixels. The slice is wider than the spot and this requires the charged electron beam optics to perform a scan along the first direction. This is illustrates by y direction deflections.
f. The length of the slice (along the X axis) is ten millimeter which is equivalent to two million pixels.

Figure 2:
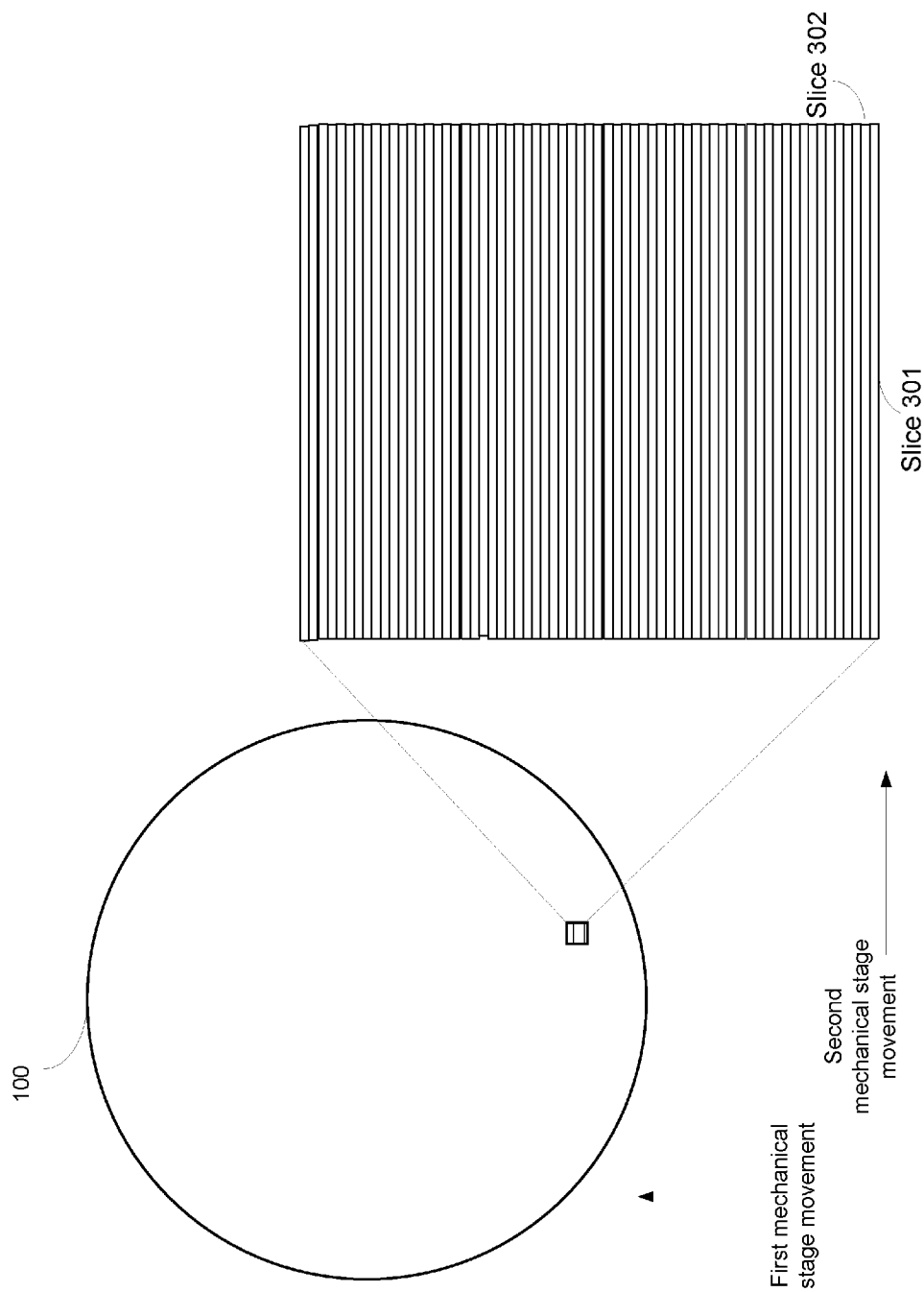
FIG. 2 illustrates object and multiple slices according to an embodiment of the invention.

FIG. 2 illustrates object 100 and multiple slices such as slice 301 and slice 302 according to an embodiment of the invention. Slices 301 and 302 are narrow and elongated. Each slice may be few millimeters long and few tens of nanometers wide. There may be multiple slices per virtual row of object 100.

Figure 3:
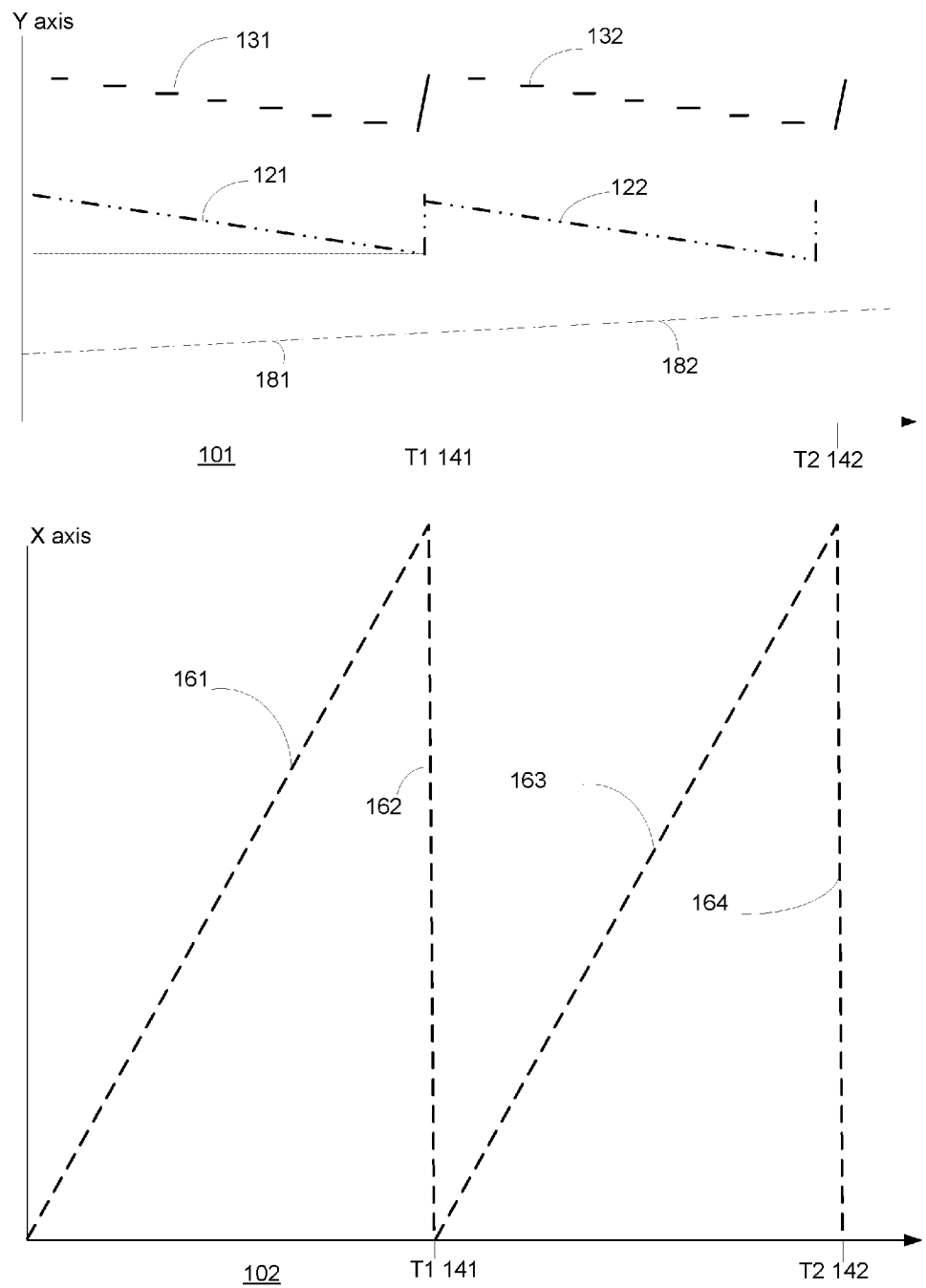
FIG. 3 illustrates movements of a first mechanical stage, y direction deflections, counter-movement deflections and movements of a second mechanical stage, according to an embodiment of the invention.

FIG. 3 illustrates movements 181 and 182 of first mechanical stage 220, y direction deflections 131 and 132, counter-movement deflections 121 and 122 as well as movements 161, 162, 163 and 164 of second mechanical stage 230, according to an embodiment of the invention.

The charging of the slice and the first playback operation occur between T0 140 and T1 141.

The imaging of the slice and the second playback operation occur between T1 141 and T2 142.

Graph 102 illustrates various movements introduced by second mechanical stage 230—such as second movement 161, first flyback operation 162, fourth movement 163 and second flyback operation 164.

Graph 101 illustrates a first movement 181 introduced by first mechanical stage 220 during the charging of the slice and a third movement 183 introduced by the first mechanical stage 220 during the imaging of the slice.

Graph 101 illustrates counter-movement deflections 121 for countering first movement 181 and counter-movement deflections 122 for countering third movement 182.

Graph 101 illustrates y direction deflections 131 executed during the charging of the slice and y direction deflections 132 executed during the imaging of the slice.

Figure 4:
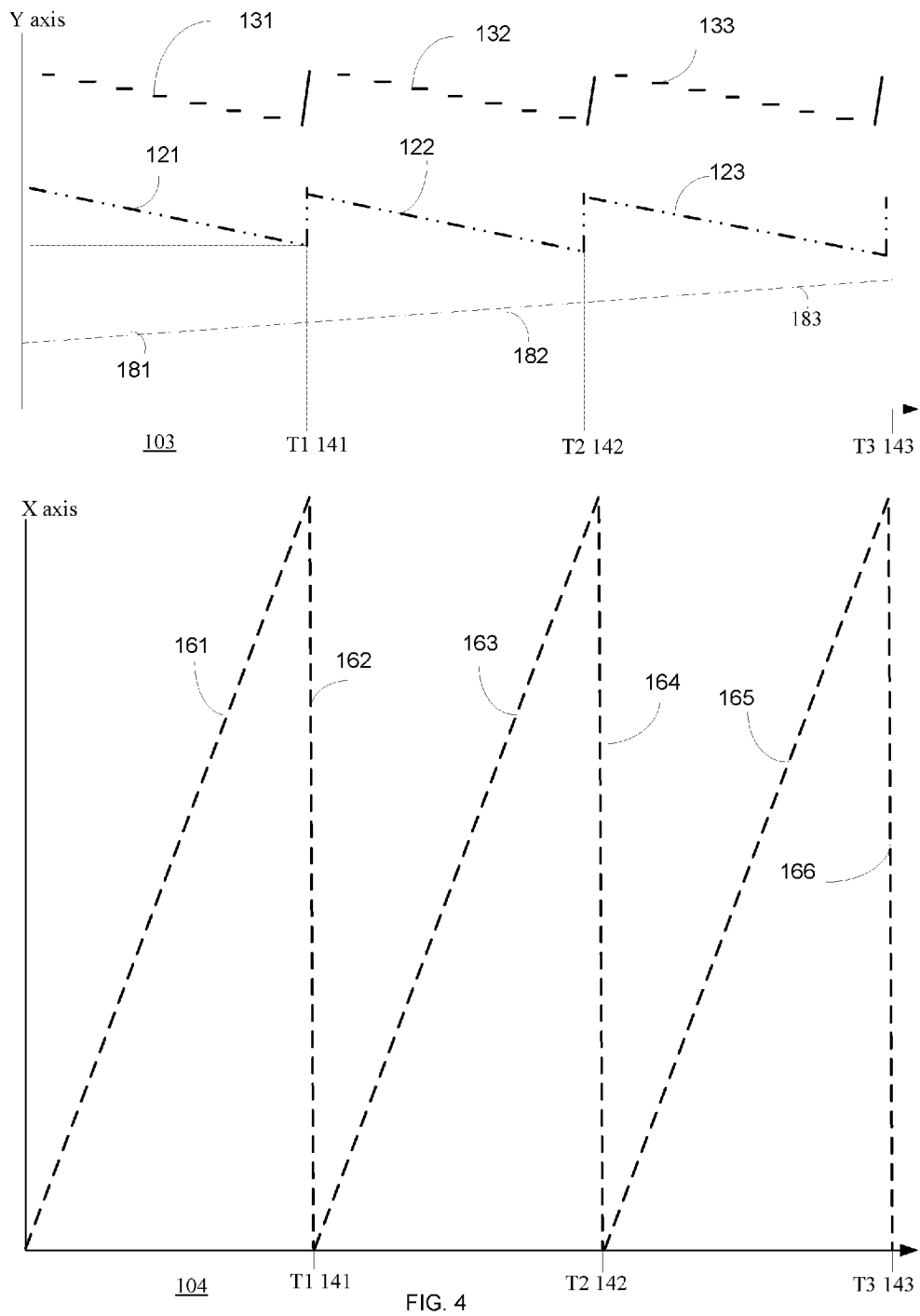
FIG. 4 illustrates movements of a first mechanical stage, y direction deflections, counter-movement deflections and movements of a second mechanical stage, according to an embodiment of the invention.

FIG. 4 illustrates movements 181, 182 and 183 of first mechanical stage 220, y direction deflections 131, y direction deflections 132, y direction deflections 133, counter-movement deflections 121, counter-movement deflections 122, counter-movement deflections 123, second movement 161, first flyback operation 162, fourth movement 163, second flyback operation 164, sixth movement 165 and third flyback operation 166 of second mechanical stage 230 according to an embodiment of the invention.

The charging of the slice and the first playback operation occur between T0 140 and T1 141.

The imaging of the slice and the second playback operation occur between T1 141 and T2 142.

The discharging of the slice and the third playback operation occur between T2 142 and T3 143.

Graph 104 illustrates movements introduced by second mechanical stage 230—such as second movement 161, first flyback operation 162, fourth movement 163, second flyback operation 164, sixth movement 165 and third flyback operation 166.

Graph 103 illustrates first movement 181 introduced by the first mechanical stage 220 during the charging of the slice, third movement 182 introduced by the first mechanical stage 220 during the imaging of the slice and fifth movement 183 introduced by the first mechanical stage 220 during the discharging of the slice.

Graph 103 illustrates counter-movement deflections 121 for countering first movement 181, counter-movement deflections 122 for countering third movement 182 and counter-movement deflections 123 for countering fifth movement 182.

Graph 103 illustrates y direction deflections 131 executed during the charging of the slice, y direction deflections 132 executed during the imaging of the slice and y direction deflections 133 executed during the discharging of the slice.

Figure 5:
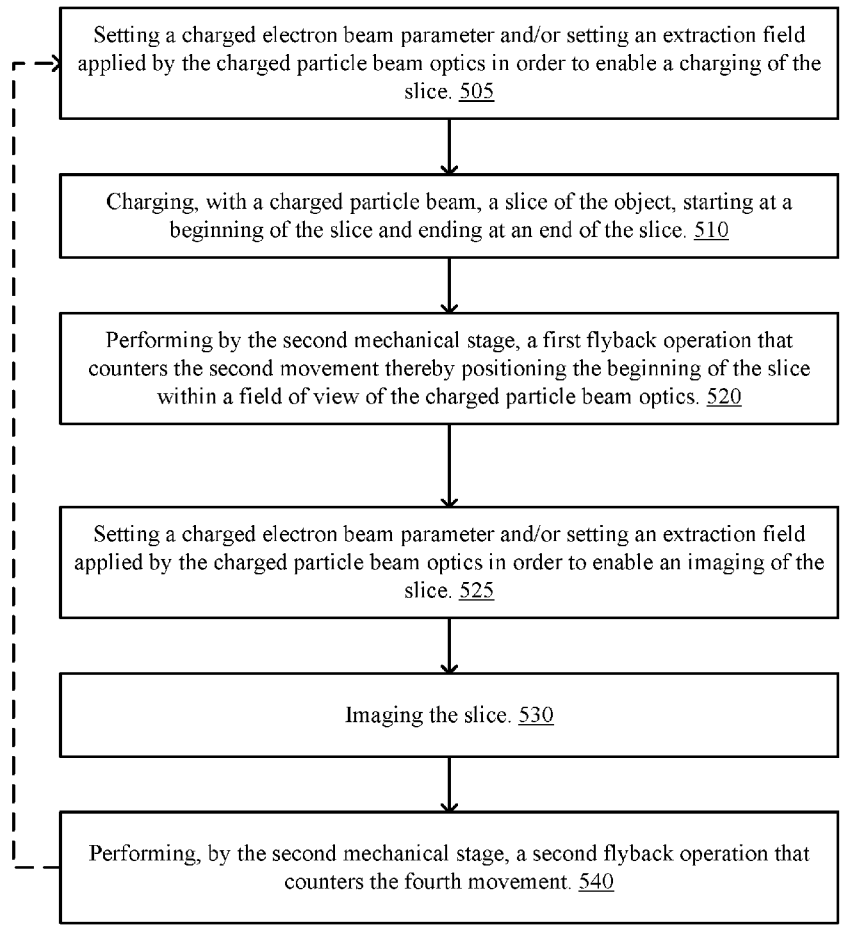
FIG. 5 illustrates a method according to an embodiment of the invention.

FIGS. 5 and 6 illustrates method 500 according to an embodiment of the invention.

Method 500 may start by step 505 of setting a charged electron beam parameter and/or setting an extraction field applied by the charged particle beam optics in order to enable a charging of the slice.

Step 505 may be followed by step 510 of charging, with a charged particle beam, a slice of the object, starting at a beginning of the slice and ending at an end of the slice. Step 510 may include steps 511, 512 and 513.

Step 511 may include introducing, by a first mechanical stage, a first movement along a first direction, between the object and charged particle beam optics.

Step 512 may include scanning the slice with the charged particle beam thereby causing the slice to be charged. Step 512 may include performing, by the charged particle beam optics, a first counter-movement deflection of the charged particle beam to at least partially counter the first movement. Step 512 may also include deflecting the charged particle beam according to a scan pattern. See, for example, y direction deflections 131, y direction deflections 132 and y direction deflections 133 of FIG. 4.

Step 513 may include introducing, by a second mechanical stage, a second movement along a second direction, between the object and the charged particle beam optics.

The second direction is oriented to the first direction. The second direction may be perpendicular to the first direction or be non-perpendicular to the first direction. The first mechanical stage is heavier than the second mechanical stage. A maximal velocity of the second mechanical stage exceeds a maximal velocity of the first mechanical stage.

Step 510 may be followed by step 520 of performing by the second mechanical stage, a first flyback operation that counters the second movement thereby positioning the beginning of the slice within a field of view of the charged particle beam optics.

Step 520 may be followed by step 525 of setting a charged electron beam parameter and/or setting an extraction field applied by the charged particle beam optics in order to enable an imaging of the slice.

Step 525 may be followed by step 530 of imaging the slice.

Step 530 may include steps 531, 532 and 533.

Step 531 may include introducing, by the first mechanical stage, a third movement along the first direction, between the object and charged particle beam optics.

Step 532 may include scanning the slice with the charged particle beam thereby causing the slice to emit charged particles that are detected and form images of areas of the slice. Step 532 may also include performing, by the charged particle beam optics, a second counter movement deflection of the charged particle beam to at least partially counter the third movement.

Step 533 may include introducing, by the second mechanical stage, a fourth movement along the second direction, between the object and the charged particle beam optics.

Step 530 may be followed by step 540 of performing, by the second mechanical stage, a second flyback operation that counters the fourth movement.

Step 540 may be followed by step 505 thereby a new slice can be charged and imaged.

Figure 7:
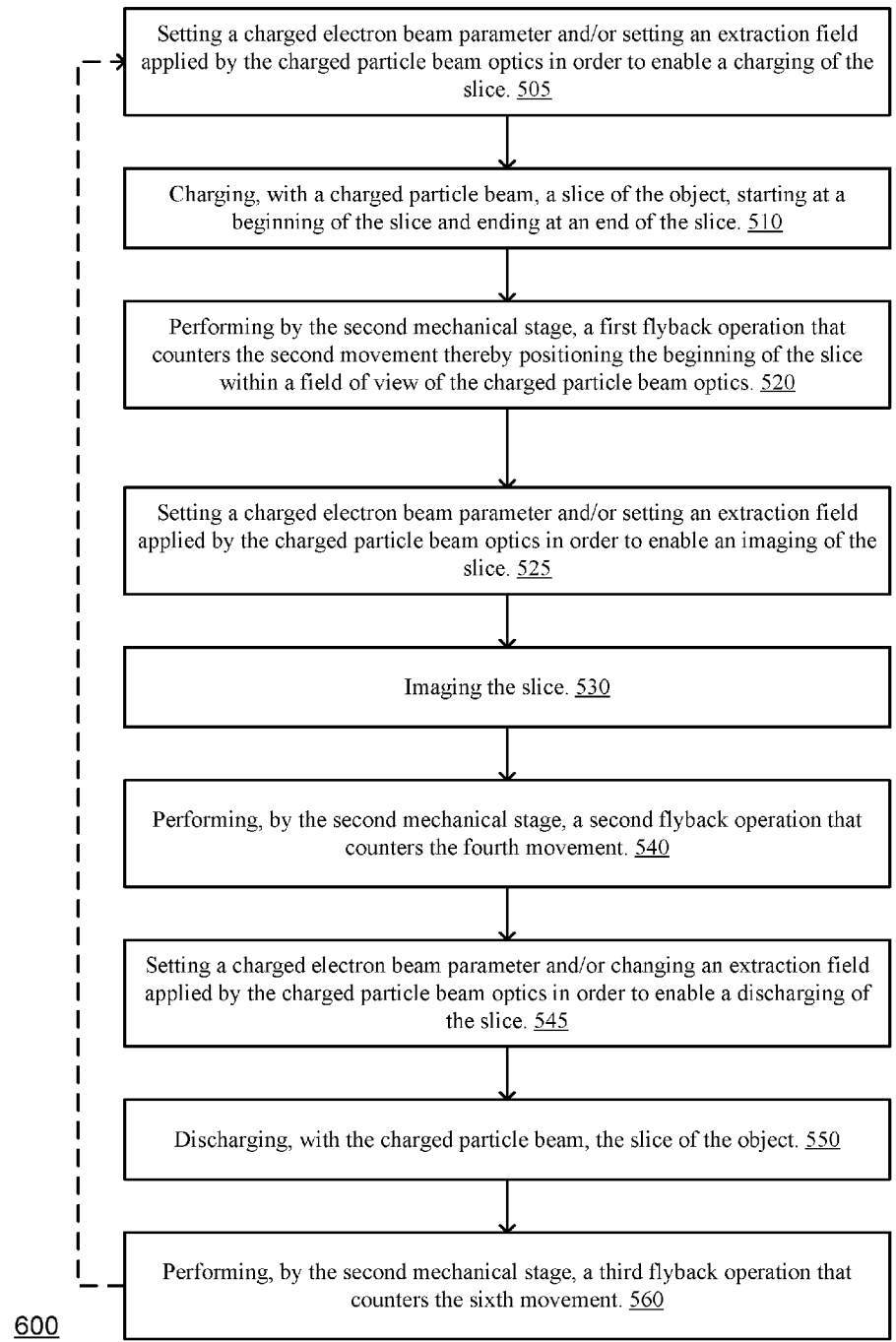
FIG. 7 illustrates a method according to an embodiment of the invention.

FIGS. 7 and 8 illustrate method 600 according to an embodiment of the invention.

Method 600 may start by steps 510, 520, 530 and 540.

Step 540 may be followed by step 545 of changing a charged electron beam parameter and/or changing an extraction field applied by the charged particle beam optics in order to enable a discharging of the slice.

Step 545 may be followed by step 550.

Step 550 may include discharging, with the charged particle beam, the slice of the object.

Step 550 may include steps 551, 552 and 553.

Step 551 may include introducing, by the first mechanical stage, a fifth movement along the first direction, between the object and charged particle beam optics.

Step 552 may include scanning the slice with the charged particle beam thereby causing the slice to be discharged. Step 552 may include performing, by the charged particle optics, a third counter-movement deflection of the charged particle beam to at least partially counter the fifth movement.

Step 553 may include introducing, by the second mechanical stage, a sixth movement along the second direction, between the object and the charged particle beam optics.

Step 550 may be followed by step 560 of performing, by the second mechanical stage, a third flyback operation that counters the sixth movement.

Step 560 may be followed by step 505 thereby a new slice can be charged, imaged and discharged.

It should be noted that a mechanical counter movement can be executed by the second mechanical stage for at least partially countering any movement of the first mechanical stage. Any mechanical counter movement executed by the second mechanical stage may be perform instead of any counter-movement deflection mentioned in the specification and/or in addition to any counter-movement deflection mentioned in the specification. For example, each one of counter-movement deflections 121, 122 and 123 may be replaced by or be executed in addition to a mechanical counter movement of the second mechanical stage. The mechanical counter movement of the second mechanical stage can be executed in addition to any other movement of the second mechanical stage.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for charge control and for imaging an object, the method comprises: charging, with a charged particle beam, a slice of the object, starting at a beginning of the slice and ending at an end of the slice; wherein the charging of the slice comprises: introducing, by a first mechanical stage, a first movement along a first direction, between the object and charged particle beam optics; scanning the slice with the charged particle beam thereby causing the slice to be charged; wherein the scanning of the slice comprises performing, by the charged particle optics, a first counter-movement deflection of the charged particle beam to at least partially counter the first movement; introducing, by a second mechanical stage, a second movement along a second direction, between the object and the charged particle beam optics; wherein the second direction is substantially perpendicular to the first direction; wherein the first mechanical stage is heavier than the second mechanical stage; wherein a maximal velocity of the second mechanical stage exceeds a maximal velocity of the first mechanical stage; upon a completion of the charging of the slice, performing by the second mechanical stage a first flyback operation that counters the second movement thereby positioning the beginning of the slice within a field of view of the charged particle beam optics; imaging the slice; wherein the imaging of the slice comprises: introducing, by the first mechanical stage, a third movement along the first direction, between the object and charged particle beam optics; performing, by the charged particle beam optics, a second counter movement deflection of the charged particle beam to at least partially counter the third movement; introducing, by the second mechanical stage, a fourth movement along the second direction, between the object and the charged particle beam optics; and upon a completion of the imaging of the slice performing, by the second mechanical stage, a second flyback operation that counters the fourth movement.

2. The method according to claim 1 wherein the performing of the second flyback operation is followed by discharging, with the charged particle beam, the slice of the object; wherein the discharging of the slice comprises:
introducing, by the first mechanical stage, a fifth movement along the first direction, between the object and charged particle beam optics;
scanning the slice with the charged particle beam thereby causing the slice to be discharged; wherein the scanning of the slice comprises performing, by the charged particle optics, a third counter-movement deflection of the charged particle beam to at least partially counter the fifth movement;
introducing, by the second mechanical stage, a sixth movement along the second direction, between the object and the charged particle beam optics; and
upon a completion of the discharging of the slice performing, by the second mechanical stage, a third flyback operation that counters the sixth movement.

3. The method according to claim 1 comprising repeating, for each slice of the object out of multiple slices of the object the steps of charging the slice, performing the first flyback operation, imaging the slice and performing the second flyback operation.

4. The method according to claim 1 wherein a ratio between an average velocity of the first flyback operation and an average velocity of the first movements exceeds ten.

5. The method according to claim 1 wherein a ratio between an average velocity of the first flyback operation and an average velocity of the first movements exceeds one hundred.

6. The method according to claim 1 wherein a ratio between a length of the slice along the second direction and a width of the slice along the first direction exceeds five hundred.

7. A system for charge control and for imaging an object, the system comprises a first mechanical stage, a second mechanical stage, charged particle beam optics and a controller; the controller programmed to cause the system to:
charge, with a charged particle beam, a slice of the object, starting at a beginning of the slice and ending at an end of the slice; wherein the charging of the slice comprises: introducing, by a first mechanical stage, a first movement along a first direction, between the object and charged particle beam optics; and scanning the slice with the charged particle beam thereby causing the slice to be charged; wherein the scanning of the slice comprises performing, by the charged particle optics, a first counter-movement deflection of the charged particle beam to at least partially counter the first movement; introducing, by a second mechanical stage, a second movement along a second direction, between the object and the charged particle beam optics; wherein the second direction is substantially perpendicular to the first direction; wherein the first mechanical stage is heavier than the second mechanical stage;
wherein a maximal velocity of the second mechanical stage exceeds a maximal velocity of the first mechanical stage; wherein upon a completion of the charging of the slice, the controller causes the system to:
perform by the second mechanical stage a first flyback operation that counters the second movement thereby positioning the beginning of the slice within a field of view of the charged particle beam optics; image the slice; wherein the imaging of the slice comprises: introducing, by the first mechanical stage, a third movement along the first direction, between the object and charged particle beam optics; performing, by the charged particle beam optics, a second counter movement deflection of the charged particle beam to at least partially counter the third movement; introducing, by the second mechanical stage, a fourth movement along the second direction, between the object and the charged particle beam optics; and upon a completion of the imaging of the slice performing, by the second mechanical stage, a second flyback operation that counters the fourth movement.

8. The system according to claim 7 wherein system is configured to discharge, after the second flyback operation, with the charged particle beam, the slice of the object; wherein during the discharging of the slice the controller causes the system to:

introduce, by the first mechanical stage, a fifth movement along the first direction, between the object and charged particle beam optics; and scan the slice with the charged particle beam thereby causing the slice to be discharged; wherein the scanning of the slice comprises performing, by the charged particle optics, a third counter-movement deflection of the charged particle beam to at least partially counter the fifth movement; introducing, by the second mechanical stage, a sixth movement along the second direction, between the object and the charged particle beam optics; and upon a completion of the discharging of the slice performing, by the second mechanical stage, a third flyback operation that counters the sixth movement.

9. The system according to claim 7 wherein the system is configured to repeat, for each slice of the object out of multiple slices of the object, a charging of the slice, a performing of the first flyback operation, an imaging of the slice and a performing of the second flyback operation.

10. The system according to claim 7 wherein a ratio between an average velocity of the first flyback operation and an average velocity of the first movements exceeds ten.

11. The system according to claim 7 wherein a ratio between an average velocity of the first flyback operation and an average velocity of the first movements exceeds one hundred.

12. The system according to claim 7 wherein a ratio between a length of the slice along the second direction and a width of the slice along the first direction exceeds five hundred.

* * * * *